(12) United States Patent
Lee

(10) Patent No.: US 10,814,809 B2
(45) Date of Patent: Oct. 27, 2020

(54) VEHICLE AND CONTROLLING METHOD THEREOF

(71) Applicants: HYUNDAI MOTOR COMPANY, Seoul (KR); KIA MOTORS CORPORATION, Seoul (KR)

(72) Inventor: EunSang Lee, Namyangju-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/592,919

(22) Filed: Oct. 4, 2019

(65) Prior Publication Data

US 2020/0180532 A1 Jun. 11, 2020

(30) Foreign Application Priority Data

Dec. 11, 2018 (KR) .................. 10-2018-0159535

(51) Int. Cl.
| | |
|---|---|
| *B60L 58/14* | (2019.01) |
| *B60R 16/033* | (2006.01) |
| *G01R 31/382* | (2019.01) |
| *G01R 31/00* | (2006.01) |
| *B60Q 9/00* | (2006.01) |

(52) U.S. Cl.
CPC .......... *B60R 16/033* (2013.01); *B60L 58/14* (2019.02); *B60Q 9/00* (2013.01); *G01R 31/007* (2013.01); *G01R 31/382* (2019.01)

(58) Field of Classification Search
CPC .......... B60L 58/14; B60Q 9/00; B60R 16/03; B60R 16/033; G01R 31/007; G01R 31/382; G01R 31/3828; G01R 31/3832; H02H 3/08; H02H 3/087; H02H 3/105; H02J 7/00716; H02J 7/0078; H02J 9/002
See application file for complete search history.

(56) References Cited

U.S. PATENT DOCUMENTS

| | | | |
|---|---|---|---|
| 2009/0058371 A1* | 3/2009 | Nakajima | ............... B60R 16/03 320/167 |
| 2013/0297147 A1* | 11/2013 | Cheon | ............... B60R 16/03 701/36 |
| 2017/0074916 A1* | 3/2017 | Jung | ............... H02J 7/0047 |
| 2018/0022299 A1* | 1/2018 | Han | ............... G01R 31/387 701/36 |
| 2018/0022313 A1* | 1/2018 | Kim | ............... G07C 9/00309 340/5.6 |
| 2018/0361962 A1* | 12/2018 | Kim | ............... B60L 1/00 |
| 2019/0337474 A1* | 11/2019 | Kakuno | ............... B60R 16/033 |

* cited by examiner

*Primary Examiner* — Levi Gannon
(74) *Attorney, Agent, or Firm* — Brinks Gilson & Lione

(57) ABSTRACT

A vehicle includes: a plurality of electric loads that consume the dark current during parking of the vehicle and modulate the dark current; a battery sensor that senses the dark current output from a battery, demodulates the dark current modulated by the plurality of electric loads, identifies the dark current consumed by each of the plurality of electric loads based on the demodulated dark current, and identifies an electric load, which consumes excess dark current, based on the dark current consumed by each of the plurality of electric loads; and an integrated control device to alert a driver of consumption of the excess dark current of the identified electric load.

20 Claims, 13 Drawing Sheets

FIG. 8

| ITEM \ CONTROLLER Hz | 1 | 2 | | 3 | 4 | | | 5 |
|---|---|---|---|---|---|---|---|---|
| | 133 | 187 | 260 | 56 | 241 | 611 | 811 | 0 |
| DARK CURRENT SPECIFICATION [mA] | 5 | 7 | | 5 | 8 | | | 5 |
| MODULATION/ DEMODULATION FREQUENCY [Hz] | 1k | 3k | | 5k | 7k | | | 9k |
| MAXIMUM DARK CURRENT [mA] | 3.2 3.0 3.1 | 2.0 2.0 2.0 | 4.6 4.4 4.5 | 4.1 4.0 3.9 | 2.2 1.8 2.0 | 3.0 3.0 2.9 | 15.6 14.4 15.0 | 4.3 3.7 4.0 |
| AVERAGE DARK CURRENT [mA] | 3 | 2 | 4.5 | 4 | 2 | 3 | 15 | 4 |

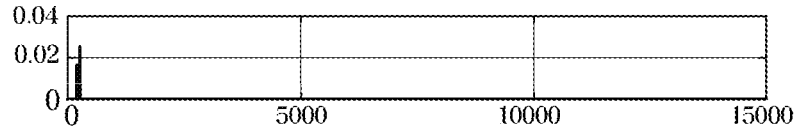

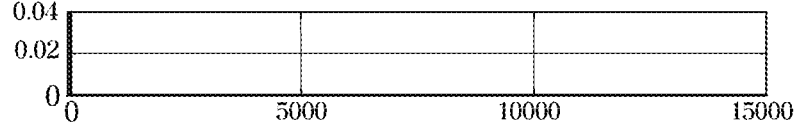

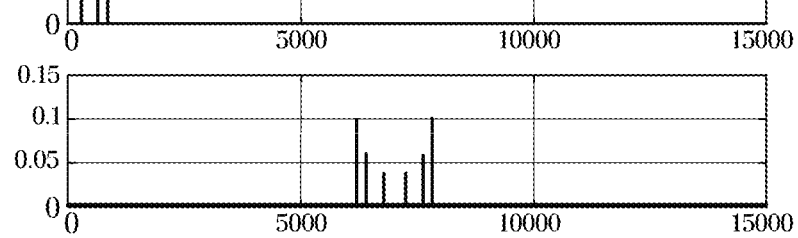

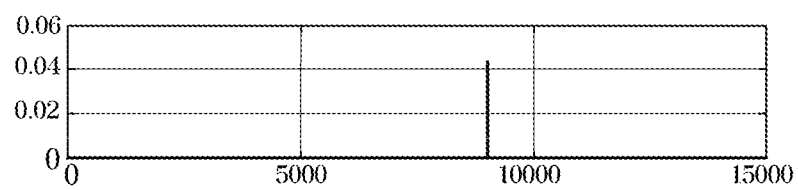

VEHICLE AND CONTROLLING METHOD THEREOF

CROSS-REFERENCE TO RELATED APPLICATION

This application claims priority to and the benefit of Korean Patent Application No. 10-2018-0159535, filed on Dec. 11, 2018, the entire contents of which are incorporated by reference in its entirety.

FIELD

The present disclosure relates to a vehicle and a control method capable of efficiently managing electrical power.

BACKGROUND

The statements in this section merely provide background information related to the present disclosure and may not constitute prior art.

In general, a vehicle is a moving means or a transportation means that travels on a road using fossil fuels, electricity, or the like as a power source. For example, the vehicle can travel using power generated from an engine.

Further, the vehicle includes a starter motor for starting the engine, and may include a battery to supply electrical power to the starter motor. When the battery is discharged due to the power supply to the starter motor, a generator in the vehicle charges the battery.

In recent years, the vehicle has various electric loads to protect a driver and provide convenience and fun to the driver. Particularly, electric vehicle loads such as power steering and seat heating consume a large amount of electric power.

These electric loads are powered from the battery. As a result, the power consumption of the battery is increased, and there arises a problem that the battery is not started, or the battery life is shortened. Particularly, there arises a problem that start-up is not performed due to a dark current during parking, or the life of the battery is shortened. Here, the dark current refers to a leakage current of which the electric load always consumes in an engine starting off state of the vehicle. For example, the dark current may refer to the current consumed in a 'sleep mode' of the electric load.

In the engine starting off state, the electric load can be classified into, for example, five loads. The electric loads may include a constant power load, a lamp load, a body load, a multimedia load, and a wake-up load. The constant power load has no separate shutdown circuit or shutdown logic and is always powered by the battery. The multimedia loads and the wake-up loads are not blocked after delivery, and are always powered by the battery. The ramp load and the body load are switched off in the sleep mode.

The electric loads in the vehicle are continuously increasing, and therefore, the dark current in a parking state is also increasing. In addition, when the vehicle is left unattended for a long period of time, the possibility of a decrease in the durability of the battery due to over-discharge of the battery and a bad start-up is increasing.

However, there is practically no method for separately monitoring the dark current of the electric load in a start-off state of the present vehicle.

SUMMARY

The present disclosure provides a vehicle and a control method thereof capable of identifying an electric load consuming a current in a parking state.

The present disclosure also provides a vehicle and a control method thereof capable of identifying electric loads through signal modulation of a dark current.

In accordance with an aspect of the present disclosure, a vehicle includes: a plurality of electric loads configured to consume a dark current during parking of the vehicle and modulate the dark current; a battery sensor configured to sense a dark current output from a battery of the vehicle, demodulate the dark current modulated by electric loads of the plurality of electric loads, identify the dark current consumed by each electric load of the plurality of electric loads based on the demodulated dark current, and identify, among the plurality of electric loads, an electric load which consumes excess dark current, based on the dark current consumed by each of the plurality of electric loads; and an integrated control device configured to alert a driver of consumption of the excess dark current of the identified electric load.

Electric loads of the plurality of electric loads may modulate the dark current using carrier signals each having a different frequency.

The battery sensor may demodulate the modulated dark current using carrier signals each having a different frequency.

Each of the electric loads may comprises: a controller configured to generate a carrier signal; a first mixer configured to mix the dark current with the carrier signal; and a high pass filter configured to block low frequency signals included in the mixed dark current.

The controller of the each of the electric loads may generate carrier signals having different frequencies.

A cut-off frequency of the high pass filter may be approximately equal to a frequency of the carrier signal.

The battery sensor may comprise: a controller configured to generate carrier signals having different frequencies; a second mixer configured to mix the modulated dark current with the carrier signals having the different frequencies; and a low pass filter configured to block high frequency signals included in the mixed dark current.

The controller may sequentially generate the carrier signals having the different frequencies, and the second mixer may sequentially mix the modulated dark current with the carrier signals having the different frequencies.

A cut-off frequency of the low pass filter may be approximately equal to the lowest frequency among the different frequencies.

The integrated control device may block power supply to the electric load, which consumes the excess dark current.

In accordance with another aspect of the present disclosure, a method for controlling a vehicle includes: modulating, by a plurality of electric loads, a dark current consumed during parking of the vehicle; demodulating, by a battery sensor, the modulated dark current output from a battery; identifying, by the battery sensor, the dark current consumed by each electric load of the plurality of electric loads based on the demodulated dark current; identifying, by the battery sensor, among the plurality of electric loads, an electric load which consumes excess dark current, based on the dark current consumed by each electric load of the plurality of electrical loads; and warning, by a control device, a driver of consumption of the excess dark current of the identified electric load.

In one form of the present disclosure, a vehicle includes: a plurality of electric loads configured to consume a dark current during parking of the vehicle and modulate the dark current; a battery sensor configured to sense a dark current output from a battery of the vehicle, demodulate the dark current modulated by electric loads of the plurality of electric loads, identify the dark current consumed by each electric load of the plurality of electric loads based on the demodulated dark current; and an integrated control device configured to identify, among the plurality of electric loads, an electric load which consumes excess dark current, based on the dark current consumed by each electric load of the plurality of electric loads, and block power supply to the electric load consuming the excessive dark current.

Each of the electric loads may include a controller configured to generate a carrier signal; a first mixer configured to mix the dark current with the carrier signal; and a high pass filter configured to block low frequency signals included in the mixed dark current.

The controller of the each of the electric loads may generate the carrier signals having different frequencies.

The battery sensor may include a controller configured to generate carrier signals having different frequencies; a second mixer configured to mix the modulated dark current with the carrier signals having the different frequencies; and a low pass filter configured to block high frequency signals included in the mixed dark current.

The controller may sequentially generate the carrier signals having the different frequencies, and the second mixer may sequentially mix the modulated dark current with the carrier signals having the different frequencies.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 5A:
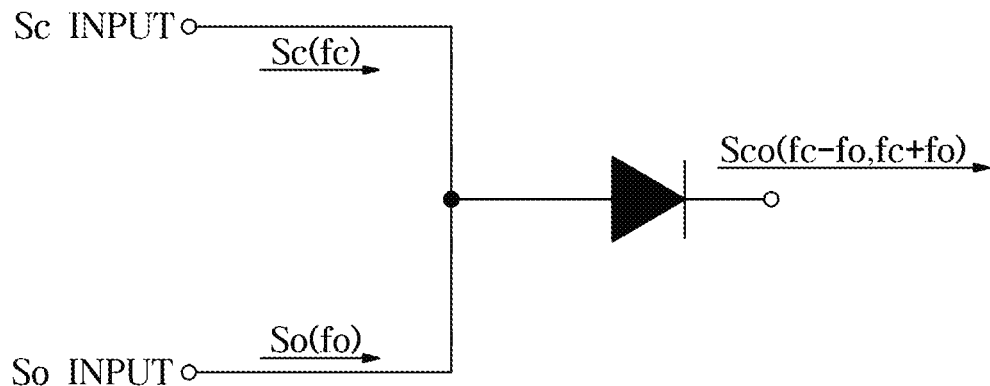
Figure 5B:
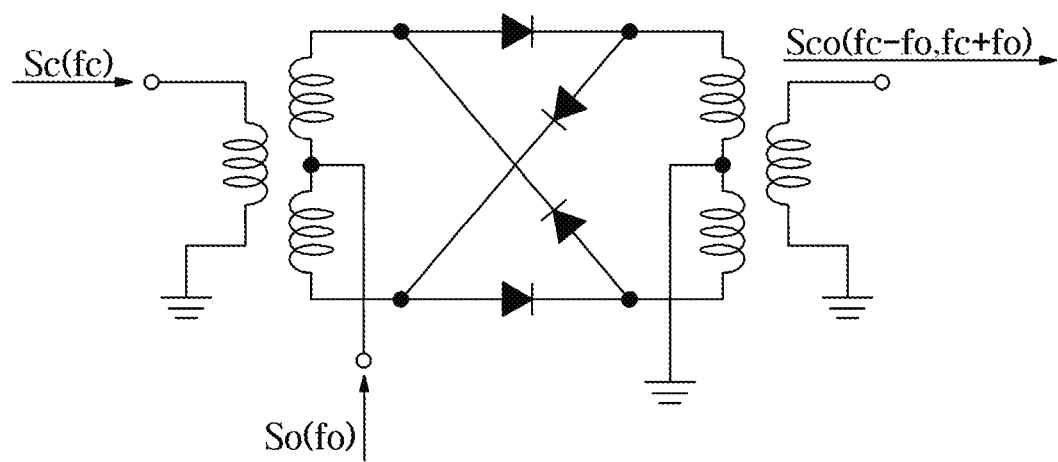
Figure 6:
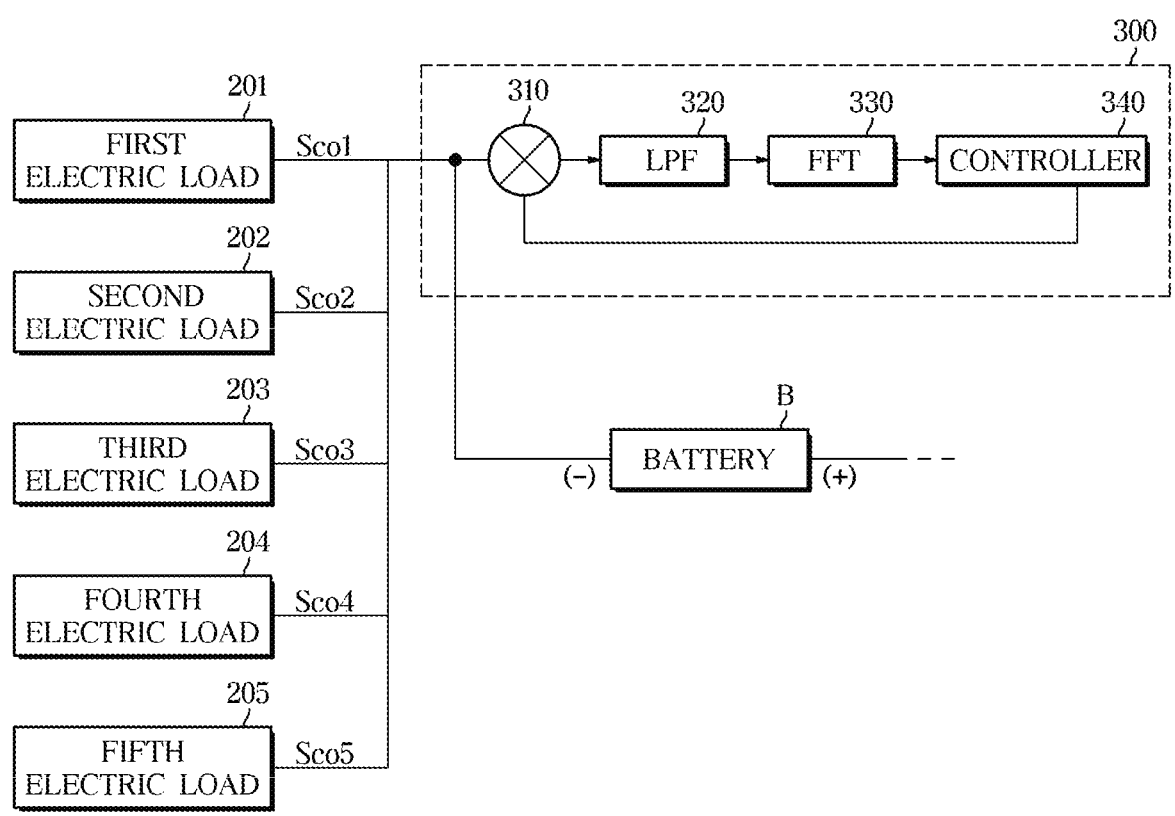
Figure 9:
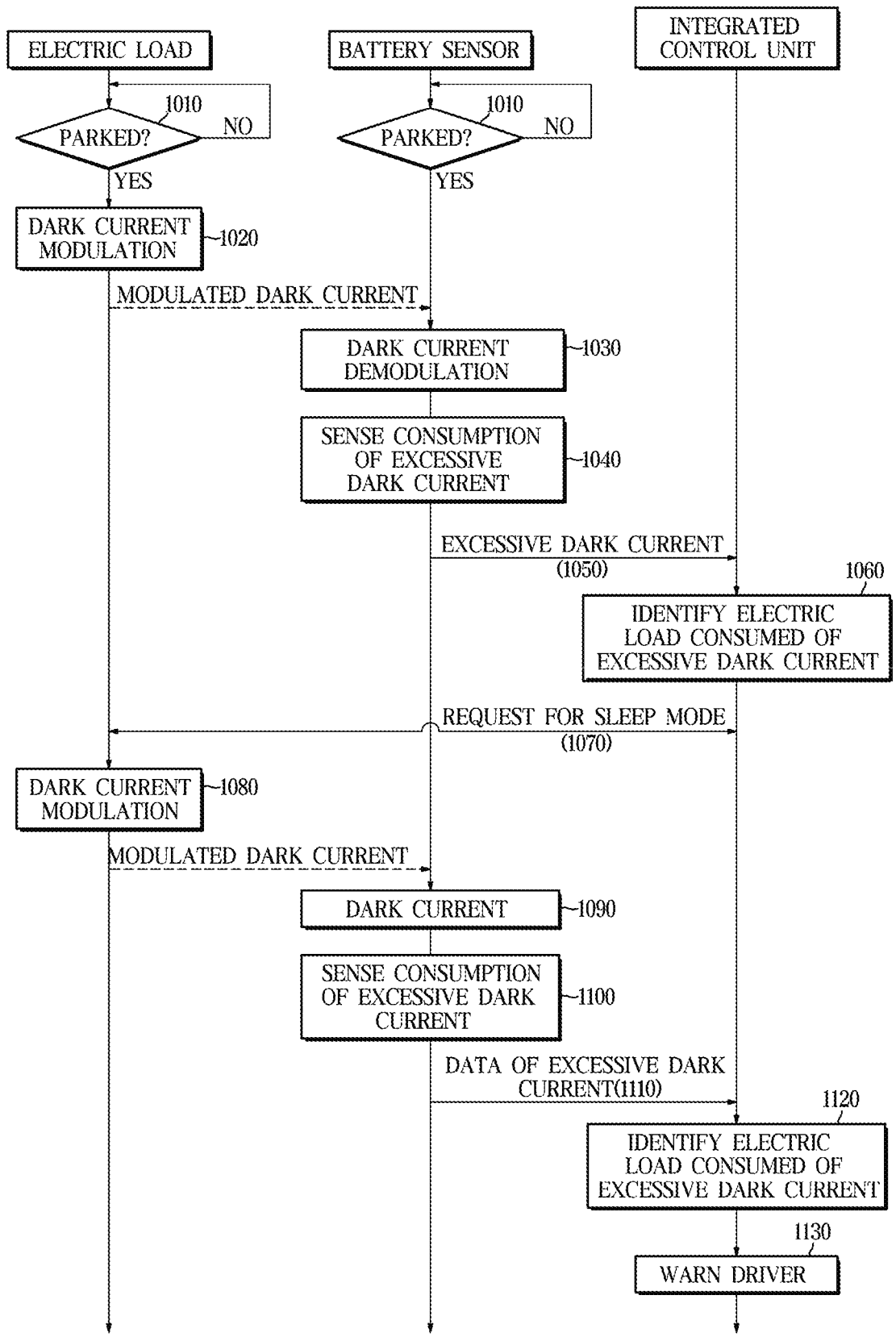
Figure 12:
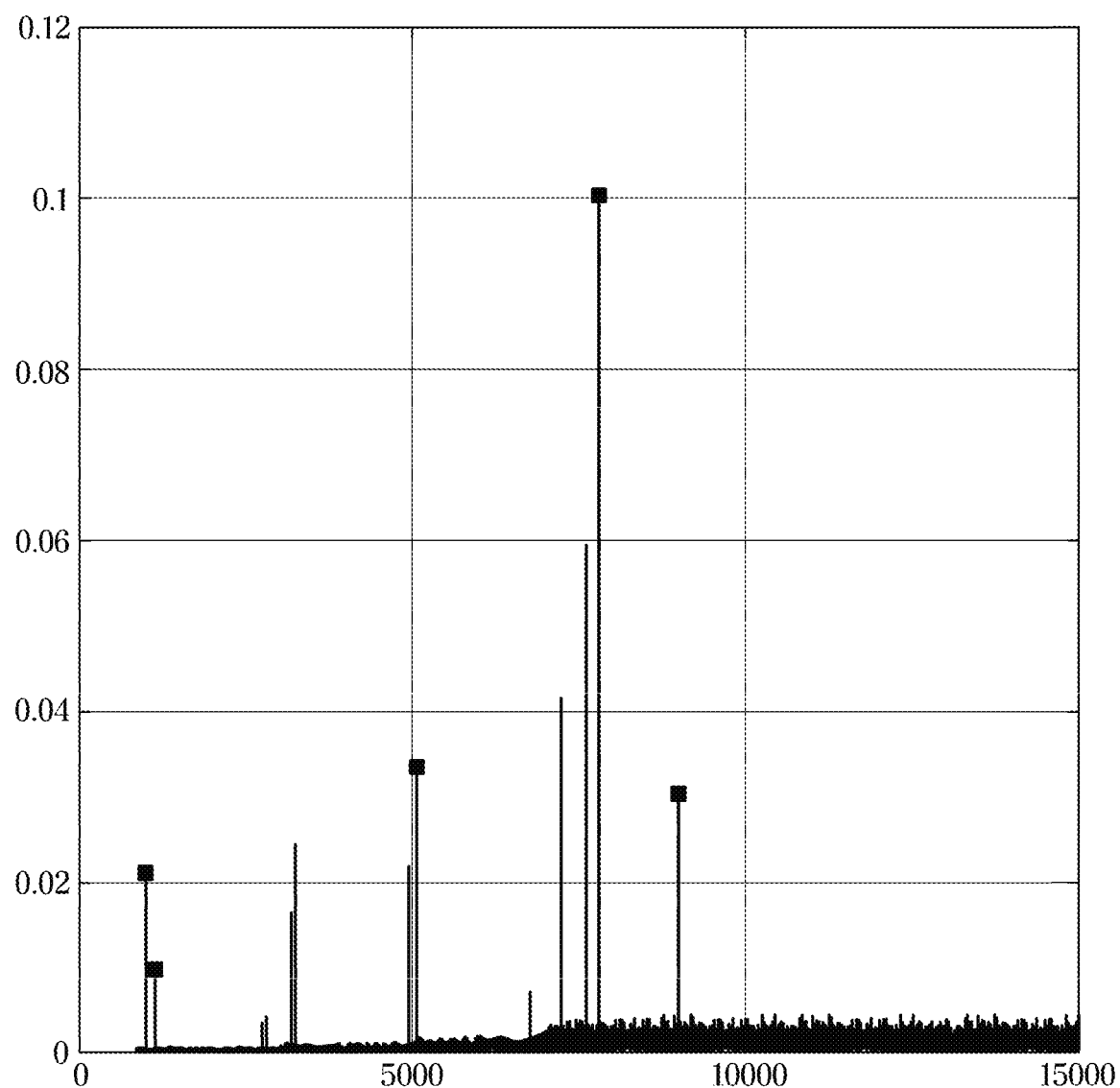

FIGS. 5A and 5B respectively illustrate a mixer included in a vehicle;

FIG. 6 shows a configuration of a battery sensor included in a vehicle;

FIGS. 7A, 7B, 7C, 7D and 7E show a spectrum of a dark current demodulated by a battery sensor included in a vehicle;

FIG. 8 shows the magnitude of a dark current demodulated by a battery sensor included in a vehicle;

FIG. 9 illustrates a flowchart of illustrating a method for identifying an electric load in a vehicle that consumes excess dark current;

FIGS. 10A, 10B, 10C, 10D and 10E show a dark current due to electric loads of a vehicle;

FIGS. 11A, 11B, 11C, 11D and 11E show views of a spectrum of a dark current and a spectrum of a modulated dark current of a vehicle's electric loads;

FIG. 12 shows views of a spectrum of a mixed dark current of a vehicle; and

FIGS. 13A, 13B, 13C, 13D and 13E show views of a spectrum of a dark current demodulated by a battery sensor of a vehicle.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing operations described is an example; however, the sequence of and/or operations is not limited to that set forth herein and may be changed as is known in the art, with the exception of operations necessarily occurring in a particular order. In addition, respective descriptions of well-known functions and constructions may be omitted for increased clarity and conciseness.

Additionally, exemplary forms will now be described more fully hereinafter with reference to the accompanying drawings. The exemplary forms may, however, be embodied in many different forms and should not be construed as being limited to the forms set forth herein. These forms are provided so that this disclosure will be thorough and complete and will fully convey the exemplary forms to those of ordinary skill in the art.

It will be understood that, although the terms first, second, etc. may be used herein to describe various elements, these elements should not be limited by these terms. These terms are only used to distinguish one element from another. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present.

The terminology used herein is for the purpose of describing particular forms only and is not intended to be limiting. As used herein, the singular forms "a," "an," and "the," are intended to include the plural forms as well, unless the context clearly indicates otherwise.

Reference will now be made in detail to the exemplary forms of the present disclosure, examples of which are illustrated in the accompanying drawings, wherein like reference numerals refer to like elements throughout.

The expression, "at least one of a, b, or c," should be understood as including only a, only b, only c, both a and b, both a and c, both b and c, or all of a, b, and c.

Hereinafter, forms of the present disclosure will be described with reference to the accompanying drawings.

Figure 1:
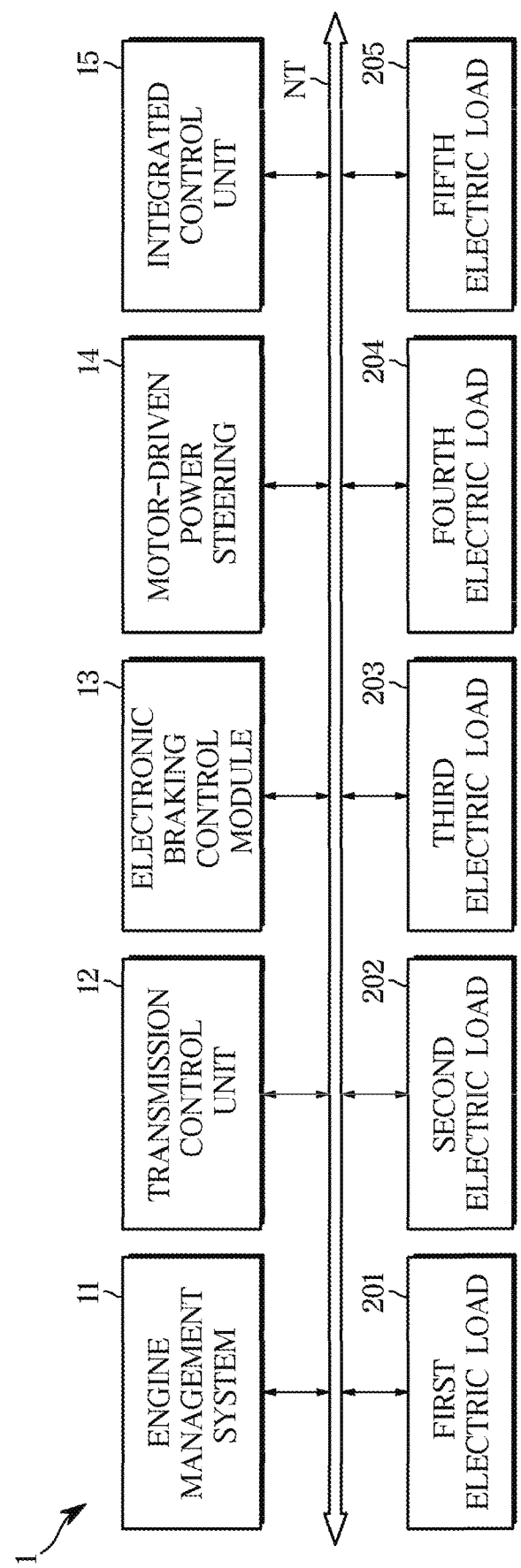
FIG. 1 is an electrical configuration of a vehicle.

FIG. 1 is an electrical configuration of a vehicle according to one form.

A vehicle 1 includes a body for forming an appearance and accommodating a driver and/or baggage, a chassis including components of the vehicle 1 other than a vehicle body, and electric loads that protect the driver and provide comfort to the driver.

For example, as shown in FIG. 1, the electric loads may include an engine management system (EMS) 11, a transmission control unit (TCU) 12, an electronic braking control module (EBCM) 13, motor-driven power steering (MDPS) 14, and an integrated control unit (ICU) 100. The vehicle 1 also includes a first electric load 201, a second electric load 202, a third electric load 203, a fourth electric load 204 and a fifth electric load 205.

The engine management system 11 can control the operation of an engine and manage the engine in response to the driver's acceleration command through an accelerator pedal. For example, the engine management system 11 may perform engine torque control, fuel consumption control, engine failure diagnosis and/or generator control.

The transmission control unit 12 can control the operation of a transmission in response to a shift command of the driver via a shift lever or the running speed of the vehicle 1. For example, the transmission control unit 12 may perform clutch control, shift control and/or engine torque control during shifting.

The electronic braking control module 13 can control a braking device of the vehicle 1 in response to the driver's braking command via a braking pedal and maintain the balance of the vehicle 1. For example, the electronic braking control module 13 may perform automatic parking braking, slip prevention during braking and/or slip prevention during steering.

The motor-driven power steering 14 can assist the driver to easily operate a steering wheel. For example, the motor-driven power steering 14 can assist in a steering operation of a user such as reducing a steering force at low-speed driving or parking and increasing the steering force at high-speed driving.

The first, second, third, fourth and fifth electric loads 201, 202, 203, 204, and 205 may be devices providing convenience to the driver. The first, second, third, fourth and fifth electric loads 201, 202, 203, 204 and 205 are, for example, audio devices, heating/ventilation/air conditioning (HVAC), a navigation device, a power seat, a seat heater, a room lamp, and the like.

The integrated control unit 100 can distribute the electric power to the electric loads of the vehicle 1 and can control the operation of the loads provided in the vehicle 1. The integrated control unit 100 can also monitor a power state of the vehicle 1 and control the operation of the electric loads based on the power state of the vehicle 1.

The integrated control unit 100 is described in further detail below.

These electric loads can communicate with each other through a vehicle communication network NT. For example, the electric loads can send and receive data through Ethernet, MOST (Media Oriented Systems Transport), Flexray, CAN (Controller Area Network), LIN (Local Interconnect Network), and the like.

Figure 2:
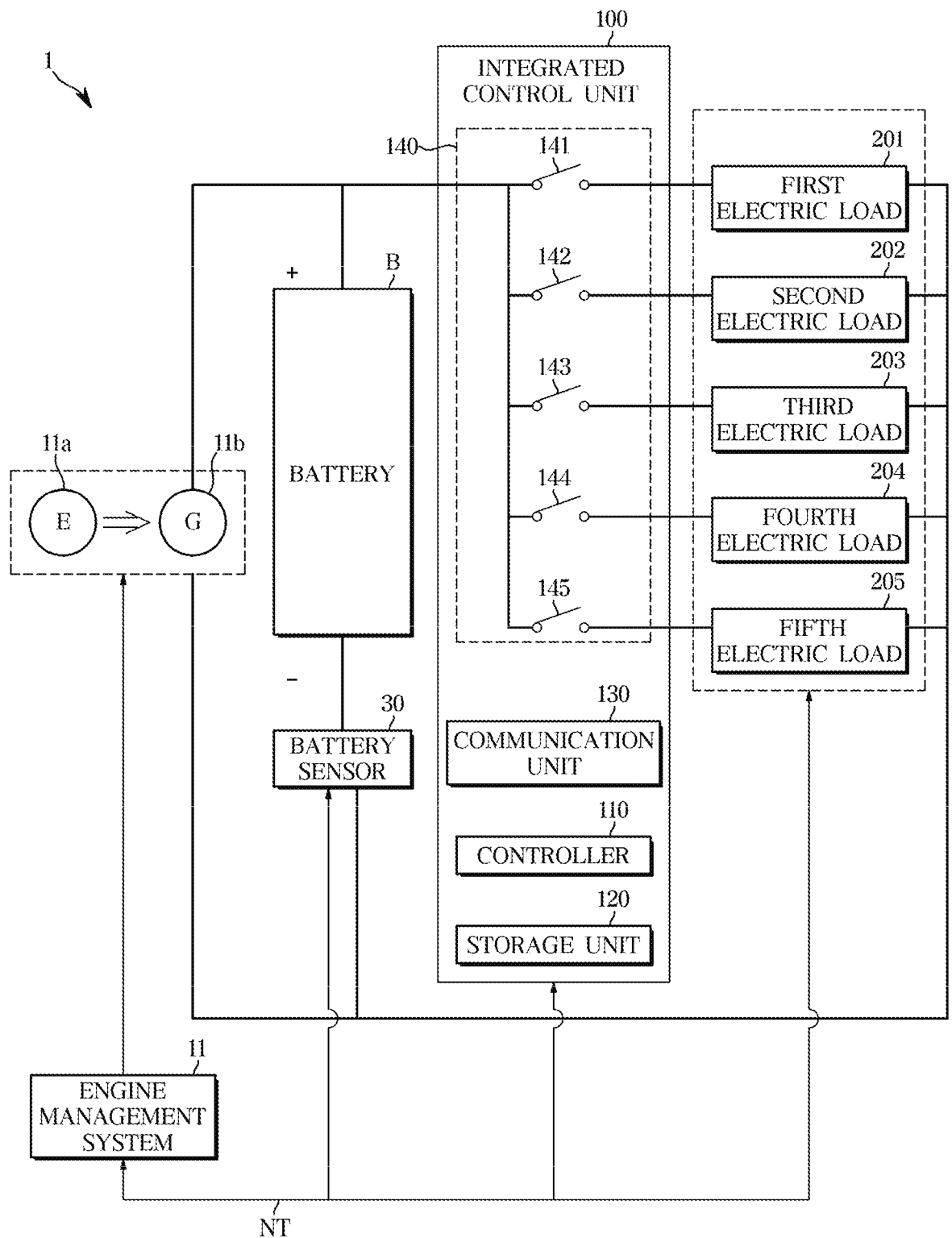
FIG. 2 is a configuration for power management of a vehicle.

FIG. 2 is a configuration for power management of a vehicle according to one form of the present disclosure.

As shown in FIG. 2, the vehicle 1 may further include an engine 11a, a generator 11b, a battery B, and a battery sensor 30.

The generator 11b can generate electrical energy, that is, electric power, by the power of the engine 11a. The engine 11a can generate power using the explosive combustion of fuel, and the power of the engine 11a can be transmitted to a wheel via the transmission. At this time, a part of the rotational force generated by the engine 11a may be provided to the generator 11b, and the generator 11b may generate electric power from the power of the engine 11a.

The generator 11b may comprise, for example, a stator having a rotor with a rotor coil (field coil) and a stator coil (armature coil). The rotor can be rotated by the rotation of the engine 11a, and the stator can be fixed. When a current is supplied to the rotor coil while the rotor is rotating by the engine 11a, a rotating magnetic field is generated, and an induced current is induced in the stator coil due to the rotating magnetic field.

Thereby, the generator 11b can produce electric power. Further, the magnitude of the magnetic field generated by the rotor changes according to the magnitude of the current supplied to the rotor coils, and the magnitude of the induced current generated in the stator coils may change. In other words, the power generation amount of a generator 21e can be adjusted according to the magnitude of the current supplied to the coil of the rotor.

A part of the electric power produced by the generator 11b may be supplied to the electric loads of the vehicle 1 and the other part may be stored in the battery B of the vehicle 1. In other words, the electric power produced by the generator 21e may be supplied to the electric loads, and the remaining electric power may be stored in the battery B.

The battery B can store the electrical energy generated from the power of the engine and supply electric power to the various electric loads included in the vehicle 1. For example, during running of the vehicle 1, the generator can convert the rotational energy of the engine into electrical energy, and the battery B can receive and store the electrical energy from the generator. In addition, the battery B can supply electric power for starting the engine to the starter motor for driving the vehicle 1 and supply electric power to the electric loads of the vehicle 1.

The battery B can supply electric power for starting the engine 11a to the generator 11b when the engine 11a is stopped and can supply electric power to the electric loads of the vehicle 1. For example, if the electric power consumed by the electric loads during running of the vehicle 1 is larger than the electric power produced by the generator 11b, the battery B can supply electric power to the electric loads, and if the engine 11a is stopped during parking, the battery B can supply electric power to the electric loads.

The battery sensor 30 can acquire status information related to the battery B. For example, the battery sensor 30 can measure the output voltage of the battery B, the output current of the battery B, the temperature of the battery B, a rated capacity Cb of the battery B, and the like.

The battery sensor 30 calculates the charging rate of the battery B based on the output voltage of the battery B, the output current of the battery B, the temperature of the battery B, and the rated capacity Cb of the battery B. Here, the charging rate of the battery B may indicate the degree of storing the electrical energy in the battery B. The charge rate generally has a value of 0 to 100% and may indicate the degree to which the battery B is charged between the fully discharged state (0%) and the full charge rate (100%).

The battery sensor 30 can transmit the charging rate of the battery B to the integrated control unit 100 through the vehicle communication network NT.

The integrated control unit 100 can receive the charge rate of the battery B from the battery sensor 30 and control the amount of power generated by the generator 11b through the engine management system 11 in accordance with the charge rate of the battery B.

The integrated control unit 100 may generate a power generation control request for controlling the power generation amount of the generator 11b according to the charging rate of the battery B. The integrated control unit 100 can transmit the power generation control request to the engine management system 11 via the vehicle communication network NT, and the engine management system 11 may increase or decrease the power generation amount of the generator 11b in response to the power generation control request of the integrated control unit 100.

The integrated control unit 100 may include a power distributor 140, a communication unit 130, a storage unit 120, and a controller 110.

The power distributor 140 includes a plurality of switches 141, 142, 143, 144, and 145 that can allow or block power supply to the electric loads of the vehicle 1. For example, the power distributor 140 includes the first switch 141 for allowing or blocking power supplied to the first electric load 201, the second switch 142 for allowing or blocking power supplied to the second electric load 202, the third switch 143 for allowing or blocking power supplied to the third electric load 203, the fourth switch 144 for allowing or blocking power supplied to the fourth electric load 204, and the fifth switch 145 that allows or blocks power supplied to the fifth electric load 205.

Each of the plurality of switches 141, 142, 143, 144, and 145 may include a latch relay. Generally, a relay contacts a contact point when a current flows through the coil, and a contact point drops when the coil is cut off. However, the latch relay is connected to the coil when a current is applied to the coil, and the contact point does not fall even if the current is cut off to the coil. The latch relay may include a separate circuit or coil to drop the contact point.

The communication unit 130 includes a CAN transceiver that receives a communication signal from the electric loads through the vehicle communication network NT and transmits the communication signal to the electric loads and a communication controller that controls the operation of the transceiver.

The CAN transceiver can receive communication data from the electric loads through the vehicle communication network NT and output the communication data to the controller 110, receive the communication data from the controller.

For example, the CAN transceiver can receive the charge rate of the battery B from the battery sensor 30 via the vehicle communication network NT. Further, the CAN transceiver can receive information on the dark current during parking from the battery sensor 30 via the vehicle communication network NT under specific conditions or periodically.

As described above, the communication unit 130 can exchange data with the electric loads of the vehicle 1 through the vehicle communication network NT, and the integrated control unit 100 can communicate with the electric loads, such as the battery sensor 30, through the communication unit 130.

The storage unit 120 may include a storage medium for storing control data for controlling the integrated control unit 100 and a storage controller for controlling storage/deletion/loading of data stored in the storage medium.

The storage medium may include a solid state drive (SSD), a magnetic disk drive (HDD), or the like, and may store various data for managing the charge rate of the battery B. For example, the storage medium may store information about the dark current received through the communication unit 130.

The storage unit 120 stores data in the storage medium according to a storage signal of the controller 110 and outputs data stored in the storage medium to the controller 110 according to a loading signal of the controller 110.

The controller 110 may include a memory for storing control programs and/or control data for controlling the integrated control unit 100, and a processor for generating control signals according to the control programs and control data stored in the memory.

The memory may temporarily store the communication data received through the communication unit 130 and/or the stored data stored in the storage unit 120. For example, the memory may temporarily store data regarding the charge rate of the battery B and/or the dark current The memory may provide the program and/or data to the processor in accordance with the memory control signal of the processor.

The memory may include a volatile memory such as Static Random Access Memory (S-RAM) for temporarily storing data, or D-Lap (Dynamic Random Access Memory). In addition, the memory may include a nonvolatile memory such as ROM (Read Only Memory), EPROM (Programmable Read Only Memory), EEPROM (Electrically Erasable Programmable Read Only Memory), and the like.

The processor may include various logic circuits and arithmetic circuits, process data according to a program provided from the memory, and generate control signals according to the processing results.

The processor can identify the electric load consuming the excessive dark current based on the information on the dark current during the parking of the vehicle 1. In addition, the processor can warn the driver of excessive dark current consumption of the electric load, or block power to the electric load that consumes the excessive dark current.

As described above, the controller 110 can identify the electric load consuming the excessive dark current based on the information on the dark current during the parking of the vehicle 1.

The electric load can insert identification information into the dark current so that the integrated control unit 100 can identify the electric load that consumes the excessive dark current and the battery sensor 30 can extract identification information of the electric load from the dark current.

Hereinafter, it is explained that the electric load inserts the identification information into the dark current and the battery sensor 30 extracts the identification information of the electric load from the dark current.

Figure 3:
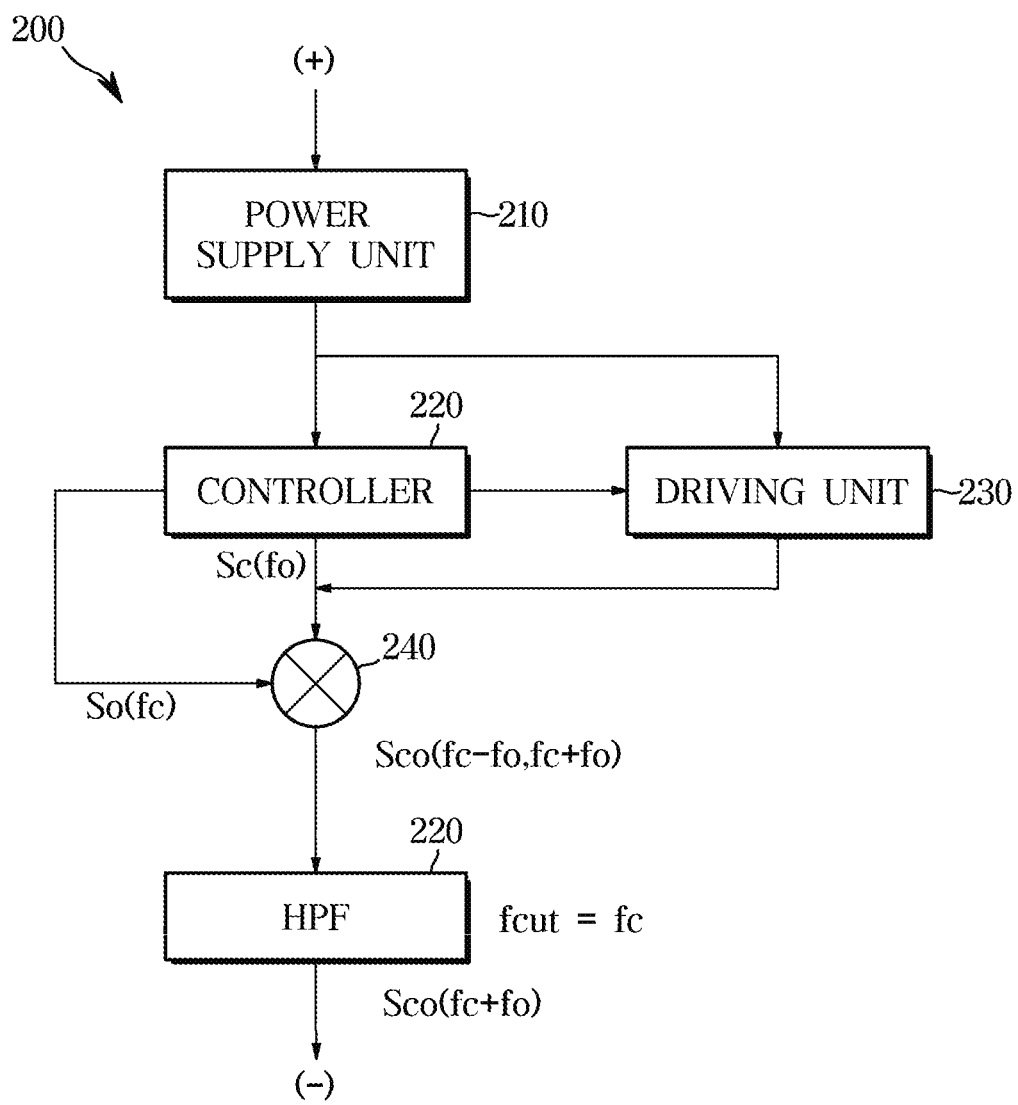
FIG. 3 shows a configuration of an electric load included in a vehicle.
Figure 4:
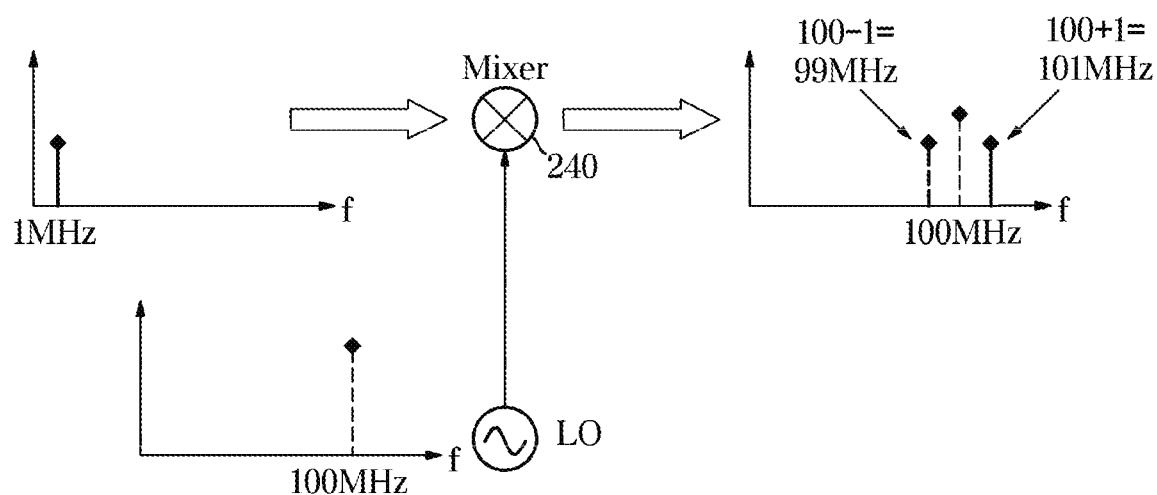
FIG. 4 shows operation of a mixer in a vehicle.

FIG. 3 shows a configuration of an electric load included in a vehicle according to one form. FIG. 4 shows operation of a mixer in a vehicle according to one form. FIGS. 5A and 5B illustrate exemplary forms of a mixer included in a vehicle.

An electric load 200 may be a variety of electrical devices as previously described. For example, the electric load 200 may be the engine management system 11, the transmission control unit 12, the electronic braking control module 13, the motor-driven power steering 14, an audio device, an air conditioner, a navigation device, a power seat, a seat heater, and a room lamp.

Referring to FIGS. 3, 4, 5A and 5B, the electric load 200 includes a power supply unit 210, a controller 220, a driving unit 230, a first mixer 240, and a high pass filter (HPF) 250

The power supply unit 210 receives power from the battery B and can supply power to the controller 220 and the driving unit 230. For example, the power supply unit 210 can drop a voltage of 12V power supplied from the battery B to 5V and supply the 5V power to the controller 220.

The controller 220 controls the operation of the driving unit 230 and the driving unit 230 can perform an operation for realizing the function of the electric load 200. For example, the driving unit of the engine management system 11 may include a throttle valve for controlling the amount of fuel supplied to the engine, and the driving unit of the electronic braking control module 13 may include a solenoid valve for controlling the hydraulic pressure supplied to the braking device.

It is typical that power supply to the driving unit 230 is blocked during the parking of the vehicle 1 when the vehicle 1 is turned off. On the other hand, the controller 220 can also operate while the vehicle 1 is parked. For example, a door lock may operate during the parking of the vehicle 1 to detect a smart key possessed by the driver, and a security camera (e.g., a black box) may be operated during the parking of the vehicle 1 to prevent theft.

Therefore, even when the vehicle 1 is parked, electric power can be supplied to the electric load.

The first mixer 240 receives a carrier signal Sc from the controller 220 and mixes a dark current So flowing through the controller 220 and/or the driving unit 230 with the carrier signal Sc. The current supplied from the battery B can flow from an anode of the battery B to the controller 220 and/or the driving unit 230 via the power supply unit 210. Further, the current may flow from the controller 220 and/or the driving unit 230 to a cathode of the battery B.

Particularly, the first mixer 240, during the parking of the vehicle 1, mixes the dark current So flowing from the controller 220 and/or the driving unit 230 to the cathode of the battery B and the carrier signal Sc of the controller 220.

The controller 220 may include an oscillator and a PLL (Phase Lock Loop) circuit for outputting the carrier signal Sc. The controller 220 can generate the carrier signal Sc having a specific carrier frequency fc for identifying the electric load 200 by using the PLL circuit. In other words, the frequencies fc of the carrier signals Sc of different electric loads are different from each other. For example, the first electric load 201 generates a first carrier signal Sc1 having a first carrier frequency fc1, and the second electric load 202 generates a second carrier signal Sc2 having a second carrier frequency fc2.

The first mixer 240 can mix the dark current So and the carrier signal Sc by multiplying the dark current So consumed by the electric load 200 by the carrier signal Sc of the controller 220 during the parking of the vehicle 1. In other words, the first mixer 240, in order for the battery sensor 30 to identify the electric load 200, the dark current So having an output frequency fo can be modulated by using the carrier signal Sc having the carrier frequency fc.

For example, the first mixer 240 can modulate the dark current So using [Equation 1].

$So(t) = Vso \sin 2\pi fot.$ $Sc(t) = Vsc \sin 2\pi fct.$ $So(t)*Sc(t) = Vso[\cos 2\pi(fc-fo)t - \cos 2\pi(fc+fo)t)].$ [Equation 1]

Here, So (t) denotes the dark current, fo denotes the output frequency of the dark current, Sc (t) denotes the carrier signal, and fc denotes the carrier frequency of the carrier signal.

As shown in [Equation 1], the first mixer 240 outputs a signal Sco having a sum fo+fc of the output frequency fo of the dark current So and the carrier frequency fc of the carrier signal Sc, and the signal Sco having the difference fc−fo between the output frequency fo of the dark current So and the carrier frequency fc of the carrier signal Sc.

For example, as shown in FIG. 4, the first mixer 240 may receive the dark current So having frequency of 1 MHz (megahertz) and the carrier signal Sc having a frequency of 100 MHz. The first mixer 240 can output a signal having a frequency of 101 MHz and a signal having a frequency of 99 MHz.

The first mixer 240 may be implemented in various forms. For example, as shown in FIG. 5A, the first mixer 240 may include a diode. The dark current So having the output frequency fo and the carrier signal Sc having the carrier frequency fc can be input to the diode. The diode outputs the signal Sco having the sum fo+fc of the carrier frequency fc of the dark current So and the output frequency fo of the dark current So, and the signal Sco having the difference fc−fo between the output frequency fo of the dark current So and the carrier frequency fc of the carrier signal Sc. As another example, as shown in FIG. 5B, the first mixer 240 may include a double-balanced mixer (DBM).

The high pass filter 250 blocks the signal Sco having the sum fo+fc of the carrier frequency fc and the output frequency fo, and the signal Sco having the difference fc−fo between the output frequency fo and the carrier frequency fc in the output signal of the first mixer 240.

For example, the high pass filter 250 may have the carrier frequency fc as a cut off frequency fcutoff. The high pass filter 250 blocks a signal having a frequency lower than the carrier frequency fc and passes a signal having a frequency higher than the carrier frequency fc.

The high pass filter 250 can prevent a harmonic problem between the dark currents of the electric loads.

As described above, the electric load 200 can modulate the dark current So consumed during the parking of the vehicle 1.

To reduce or minimize the power consumption due to the modulation of the dark current So, the electric load 200 can modulate the dark current So at a predetermined time. For example, after 10 minutes after start-off, 60 minutes after start-off, 4 hours after start-off, 8 hours after start-off, 12 hours after start-off, and 24 hours after the start-off, each of the electric loads 200 can modulate the dark current So using the carrier signal Sc.

FIG. 6 shows a configuration of a battery sensor included in a vehicle according to one form of the present disclosure.

FIGS. 7A-7E respectively show a spectrum of a dark current demodulated by a battery sensor included in a vehicle according to an exemplary form of the present disclosure. FIG. 8 shows the magnitude of a dark current demodulated by a battery sensor included in a vehicle according to one form of the present disclosure.

As shown in FIG. 6, a first modulated dark current Sco1 from the first electric load 201, a second modulated dark current Sco2 from the second electric load 202, a third modulated dark current Sco3 from the third electric load 203, a fourth modulated dark current Sco4 from the fourth electric load 204 and a fifth modulated dark current Sco5 from the fifth electric load 205 flow through the battery sensor 30 to the cathode of the battery B.

The dark current is generated by mixing the first modulated dark current Sco1, the second modulated dark current Sco2, the third modulated dark current Sco3, the fourth modulated dark current Sco4 and the fifth modulated dark current Sco5, and the mixed dark current may flow through the battery sensor 30 to the cathode of the battery B.

The battery sensor 30 may extract the first modulated dark current Sco1, the second modulated dark current Sco2, the third modulated dark current Sco3, the fourth modulated dark current Sco4, and the fifth modulated dark current Sco5 respectively in the mixed dark current.

Referring to FIGS. 6, 7A-7E, and 8, the battery sensor 30 may include a second mixer 310, a low pass filter 320, a Fourier transformer 330, and a controller 340.

The second mixer 310 receives the carrier signals Sc1, Sc2, and carrier signals Sc3, Sc4, and Sc5 from the controller 340 and mixes the mixed dark currents Sco1+Sco2+Sco3+Sco4+Sco5 and the plurality of carrier signals Sc1, Sc2, Sc3, Sc4, and Sc5.

The controller 340 may include the oscillator and the PLL (Phase Lock Loop) circuit for outputting the plurality of carrier signals Sc1, Sc2, Sc3, Sc4, and Sc5. The controller, by using the PLL circuit, generates the plurality of carrier signals Sc1d, Sc2, and Sc3 having a plurality of the carrier frequencies fc1, fc2, fc3, fc4, and fc5 for identifying the electric loads 200.

The controller 340 may sequentially output the plurality of carrier signals Sc1, Sc2, Sc3, Sc4, and Sc5 to the second mixer 310. For example, the controller 340 outputs the first carrier signal Sc1 to the second mixer 310, then outputs the second carrier signal Sc2 to the second mixer 310, and then outputs the third carrier signal Sc3 to the second mixer 310 and then outputs the fourth carrier signal Sc4 to the second mixer 310 and then the fifth carrier signal Sc5 to the second mixer 310.

The second mixer 310 mixes the mixed dark currents (Sco1+Sco2+Sco3+Sco4+Sco5) and the plurality of carrier signals Sc1, Sc2, Sc3, Sc4, and Sc5 by multiplying the mixed dark currents Sco1+Sco2+Sco3+Sco4+Sco5 and the plurality of carrier signals Sc1, Sc2, Sc3, Sc4, Sco4, and Sco5. In other words, the second mixer 310, to identify the electric loads 200, can demodulate dark currents So1, So2, So3, So4, and So5 by using the plurality of carrier signals Sc1, Sc2, Sc3, Sc4 and Sc5 having the different carrier frequencies fc1, fc2, fc3, fc4 and fc5.

The second mixer 310 may be implemented in various forms. As shown in FIG. 5A, the second mixer 310 may include the diode. In addition, as shown in FIG. 5B, the first mixer 240 may include the double-balanced mixer (DBM).

The low pass filter 320 selectively passes a signal indicative of the original dark current in the output signal of the second mixer 310 and can block other signals. The low pass filter 320 includes a signal having a first output frequency fo1, a signal having a second output frequency fo2, a signal having a third output frequency fo3, a signal having a fourth output frequency fo4, and a signal having a fifth output frequency fo5.

The low pass filter 320 can have the lowest frequency among the plurality of carrier signals Sc1, Sc2, Sc3, Sc4, and Sc5 as the cutoff frequency fcutoff.

The frequency of the first modulated dark current Sco1 in the mixed dark currents Sco1+Sco2+Sco3+Sco4+Sco5 may be equal to the sum of the first output frequency fo1 and the first carrier frequency fc1. When the first modulated dark current Sco1 by the second mixer 310 is mixed with the first carrier signal Sc1 having the first carrier frequency fc1, a signal having the frequency of fo1+fc1+fc1 as the frequency and a signal having the first output frequency fo1 are outputted.

A signal having the frequency of fo1+fc1+fc1 as a frequency is blocked by the low pass filter 320 and a signal having the first output frequency fo1 can pass through the low pass filter 320. The signal having the first output frequency fo1 may be the same as the first dark current So1 of the first electric load 201.

As described above, the first dark current So1 of the first electric load 201 is extracted from the mixed dark currents Sco1+Sco2+Sco3+Sco4+Sco5 by the first carrier signal Sc1 having the first carrier frequency fc1.

In the same way, the second dark current So2 of the second electric load 202 is extracted from the mixed dark currents Sco1+Sco2+Sco3+Sco4+Sco5 by the second carrier signal Sc2 having the second carrier frequency fc2. In the same way, the third dark current So3 of the third electric load 203 is extracted from the mixed dark currents Sco1+Sco2+Sco3+Sco4+Sco5 by the third carrier signal Sc3 having the third carrier frequency fc3. The fourth dark current So4 of the fourth electric load 204 is extracted from the mixed dark currents Sco1+Sco2+Sco3+Sco4+Sco5 by the fourth carrier signal Sc4 having the fourth carrier frequency fc4. The fifth dark current So5 of the fifth electric load 205 is extracted from the mixed dark currents Sco1+Sco2+Sco3+Sco4+Sco5 by the fifth carrier signal Sc5 having the fifth carrier frequency fc5.

The Fourier transformer 330 may convert the dark current signals of the electric loads 201, 202, 203, 204, and 205 into the frequency domain. The Fourier transformer 330 may extract the frequency components included in the dark current signals of the electric loads 201, 202, 203, 204, and 205.

Figure 7A:
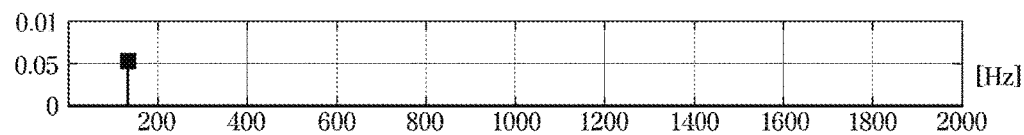

For example, while the first carrier signal Sc1 is outputted from the controller 340, the Fourier transformer 330 converts the first dark current So1 of the first electric load 201 into the frequency domain, and outputs information on the frequency component of the first dark current So1 to the controller. As shown in FIG. 7A, the Fourier transformer 330 can output a current value of 5 mA to the controller 340 at a frequency of 133 Hz included in the first dark current So1.

Figure 7B:
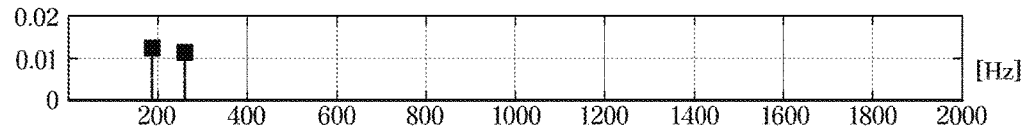

While the second carrier signal Sc2 is outputted from the controller 340, the Fourier transformer 330 converts the second dark current So2 of the second electric load 202 into the frequency domain, and outputs information on the frequency component of the second dark current So2 to the controller. As shown in FIG. 7B, the Fourier transformer 330 can output a current value of 12 mA at a frequency of 187 Hz and a current value of 11 mA at a frequency of 260 Hz to the controller 340 included in the second dark current So2.

Figure 7C:
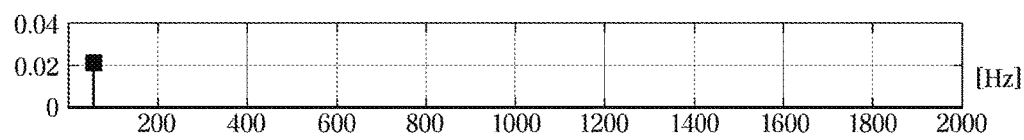
Figure 7D:
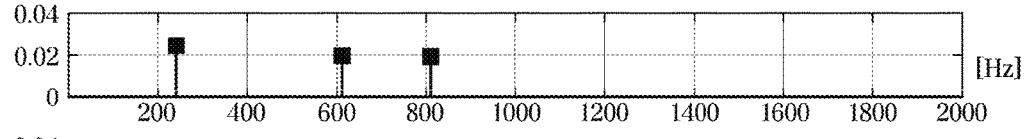
Figure 7E:
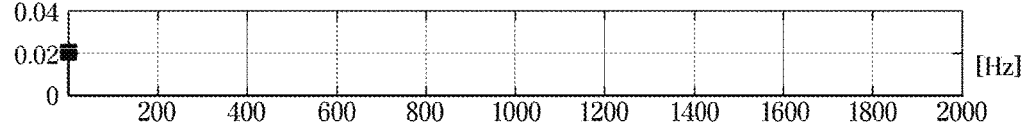

In the same way, the Fourier transformer 330, as shown in FIGS. 7C, 7D and 7E, outputs information on the frequency component of the third dark current So3, information on the frequency component of the fourth dark current So4, and information on the frequency component of the fifth dark current So5 to the controller 340. The Fourier transformer 330 outputs a current value of 21 mA at 56 Hz included in the third dark current So3, a current value of 24 mA at 241 Hz, a current value of 20 mA at 611 Hz and a current value of 18 mA at 811 Hz included in the fourth dark current So4, and a current value of DC 200 mA included in the fifth dark current So 5 to the controller 340.

The controller 340 may store the frequency components in the form of a table for each of the electric loads. For example, the controller 340 may store the current value of the first dark current So1, the current value of the second dark current So2, the current value of the third dark current So3, the current value of the fourth dark current So4, and the current value of the fifth dark current So5 respectively.

As shown in FIG. 8, the controller 340 may store a table including a dark current specification (allowable current value), a demodulation frequency, a maximum dark current and an average dark current for each of the electric loads 201, 202, 203, 204, and 205.

The controller 340 can identify the excessive amount of the dark current based on the table.

The controller 340 can measure the maximum dark current of the electric load three times or more, and if the average of the maximum dark current of the electric load is larger than the specification (allowable current value) of the dark current, the controller 340 can recognize that the electric load consumes excessive dark current. In the example shown in FIG. 8, the controller 340 can identify the excessive dark current of the fourth electric load 204.

The controller 340 may transmit the information on the excessive dark current to the integrated control unit 100 through the vehicle communication network NT. For example, the controller 340 may transmit the maximum dark current and the average dark current of each of the electric loads to the integrated control unit 100 or may transmit the identification information of the electric apparatus consuming the excessive dark current to the integrated control unit 100.

The integrated control unit 100 can identify the electric load consuming the excessive dark current based on the information on the dark current received from the battery sensor 30. The integrated control unit 100 may request to enter a "sleep mode" through the vehicle communication network NT to the electrical load (e.g., the fourth electric load) consuming the excessive dark current.

Thereafter, if the dark current is not reduced, the integrated control unit 100 can block the power supply to the electric load consuming the excessive dark current.

In addition, the integrated control unit 100 can warn the driver of excessive dark current consumption of the electric load. For example, if the current charging rate of a 50 Ah battery is 60%, the total dark current is 500 mA, and the specific electric load is consuming 200 mA of the excessive dark current, and the battery is consumed at 500 mAh per hour for 10 hours, and it can consume about 5 A of current. As a result, the charging rate of the battery reaches 50%. Assuming that the charge rate of the battery for a stable start is 50%, the integrated control unit 100 can notify the driver that the vehicle can be driven to charge the battery or visit a workshop before 10 hours have elapsed.

As described above, in order to identify the dark currents consumed by the plurality of electric loads, the electric loads can modulate the dark currents using the carrier signals having different carrier frequencies, respectively. The battery sensor can demodulate the dark currents using the carrier signals having different carrier frequencies and can identify the electric load that consume the excessive dark current based on the demodulated dark current.

FIG. 9 illustrates a method for identifying an electric load in a vehicle that consumes excess dark current according to another form of the present disclosure. FIGS. 10A-10E respectively show a dark current due to electric loads of a vehicle according to one form of the present disclosure. FIGS. 11A-11E respectively show views of a spectrum of a dark current and a spectrum of a modulated dark current of a vehicle's electric loads according to one form of the present disclosure. FIG. 12 shows views of a spectrum of a mixed dark current of a vehicle according to one form of the present disclosure. FIGS. 13A-13E respectively show views of a spectrum of a dark current demodulated by a battery sensor of a vehicle according to one form of the present disclosure.

Referring to FIGS. 9, 10A-10E, 11A-11E, 12, and 13A-13E, the electric load 200 and the battery sensor 30 respectively identify whether the vehicle 1 is parked (1010, 1011).

The electric load 200 and the battery sensor 30 can respectively identify whether the vehicle 1 is parked based on whether the vehicle 1 is turned on or off.

If the vehicle 1 is parked (YES in 1010), the electric loads 200 modulate the dark current (1020).

Figure 10A:
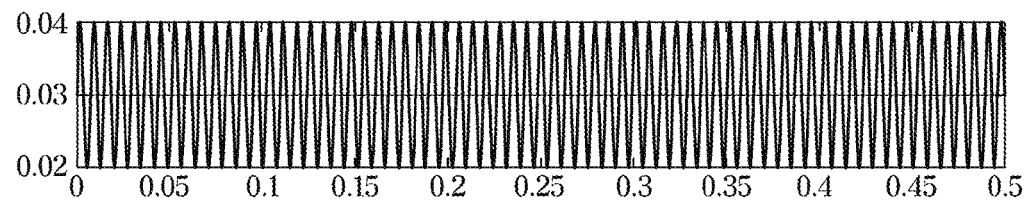
Figure 10B:
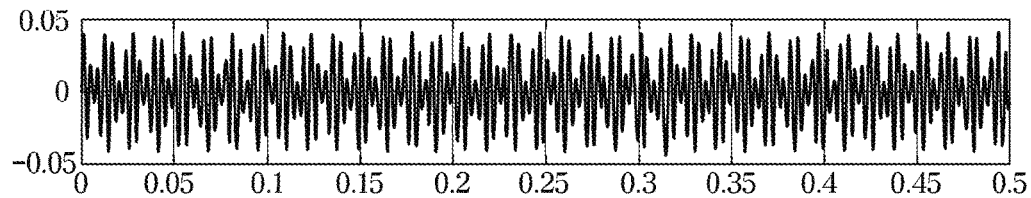
Figure 10C:
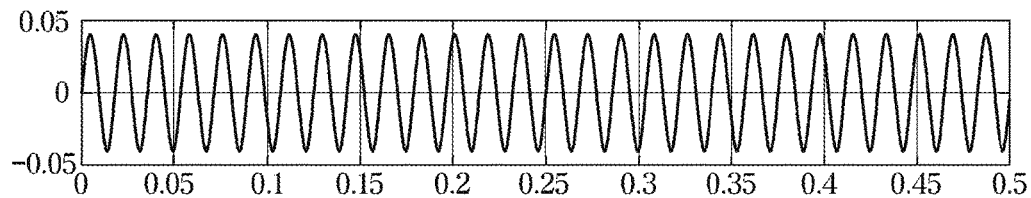
Figure 10D:
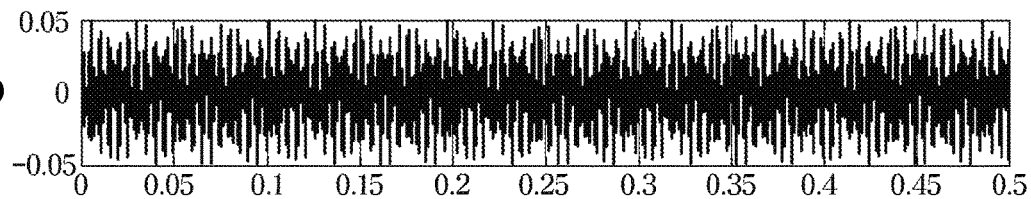
Figure 10E:
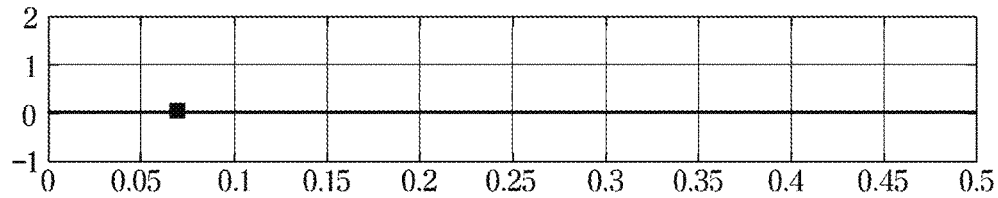

During the parking of the vehicle 1, the electric loads 200 can consume the dark current So. For example, the first electric load 201 may consume the first dark current So1 as shown in FIG. 10A. The second electric load 202 may consume the second dark current So2 as shown in FIG. 10B. The third electric load 203 may consume the third dark current So3 as shown in FIG. 10C. The fourth electric load 204 may consume the fourth dark current So4 as shown in FIG. 10D. The fifth electric load 205 may consume the fifth dark current So5 as shown in FIG. 10E.

The electric load 200 can modulate the dark current So with the output frequency fo by using the carrier signal Sc having the carrier frequency fc so that the electric load 200 is identified. Specifically, the electric load 200 can mix the carrier signal Sc and the dark current So by multiplying the carrier signal Sc having the carrier frequency fc by the dark current So having the output frequency fo.

Figure 11A:
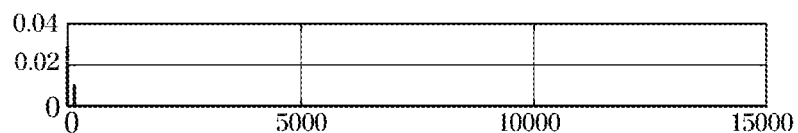
Figure 11B:
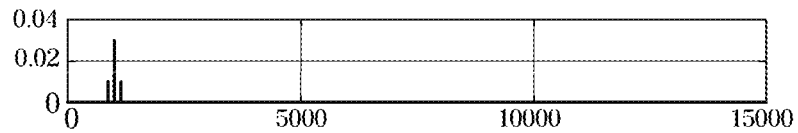
Figure 11C:
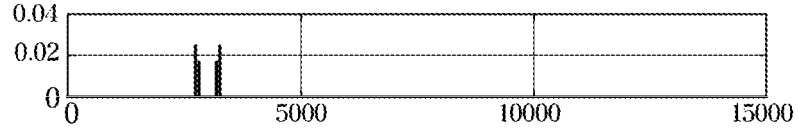
Figure 11D:
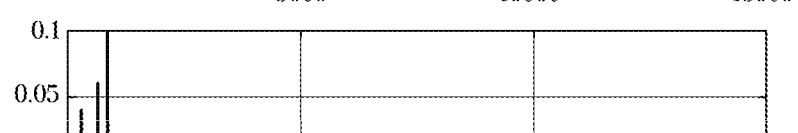
Figure 11E:
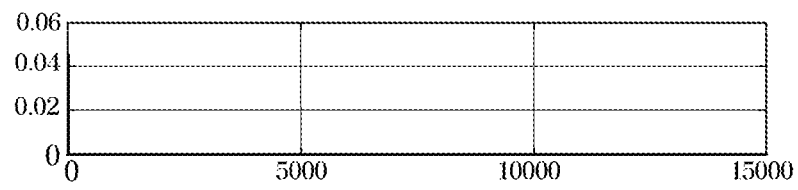

The different electric loads can modulate the dark current using the carrier signals having the different carry frequencies. For example, the first electric load 201 can modulate the first dark current So1 using the first carrier signal Sc1 having the first carrier frequency fc1 as shown in FIG. 11A. The second electric load 202 can modulate the second dark current So2 using the second carrier signal Sc2 having the second carrier frequency fc2 as shown in FIG. 11B. The third electric load 203 can modulate the third dark current So3 using the third carrier signal Sc3 having the third carrier frequency fc3 as shown in FIG. 11C. The fourth electric load 204 can modulate the fourth dark current So4 using the fourth carrier signal Sc4 having the fourth carrier frequency fc4 as shown in FIG. 11D. The fifth electric load 205 can modulate the fifth dark current So5 using the fifth carrier signal Sc5 having the fifth carrier frequency fc5 as shown in FIG. 11E.

The modulated dark current Sco may flow through the battery sensor 30 to the cathode of the battery B. The modulated dark current Sco passing through the battery sensor 30 may be the mixed dark currents Sco1+Sco2+Sco3+Sco4+Sco5 mixed with the dark currents Sco1, Sco2, Sco3, Sco4, and Sco5 modulated by the plurality of electric loads 201, 202, 203, 204, and 205 as shown in FIG. 12.

If the vehicle 1 is parked (YES in 1011), the battery sensor 30 demodulates the dark current (1030).

The battery sensor 30 can demodulate the mixed dark currents Sco1+Sco2+Sco3+Sco4+Sco5 using the carrier signal Sc having the carrier frequency fc.

Figure 13A:
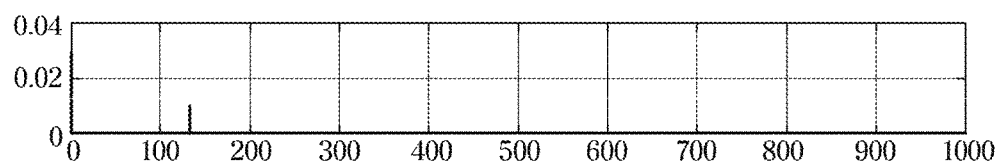
Figure 13B:
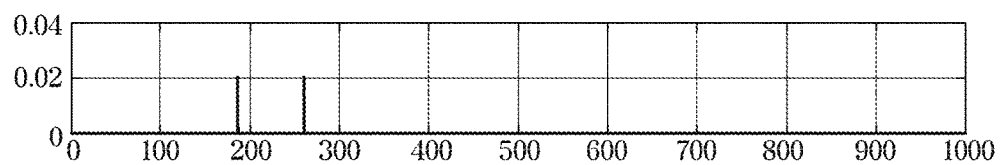
Figure 13C:
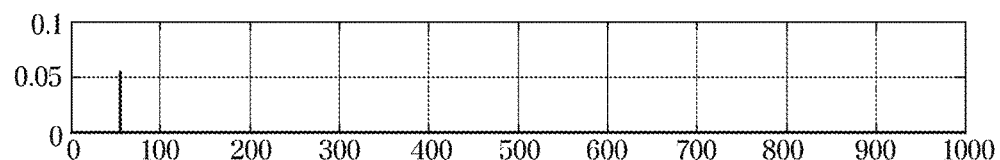
Figure 13D:
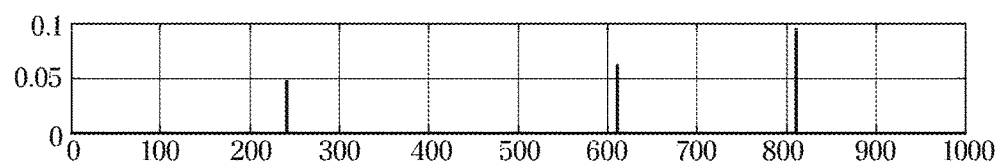
Figure 13E:
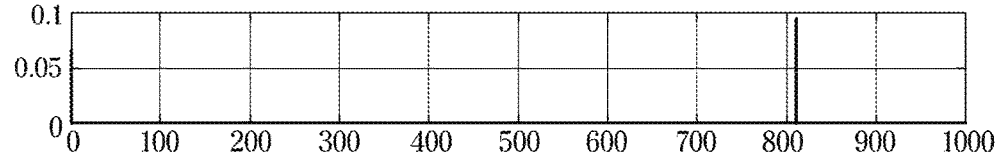

Specifically, the battery sensor 30 can extract the dark current So by multiplying the dark currents Sco1+Sco2+Sco3+Sco4+Sco5 mixed with the carrier signal Sc having the carrier frequency fc. For example, the battery sensor 30 multiplies the first carrier signal Sc1 having the first carrier frequency fc1 by the mixed dark currents Sco1+Sco2+Sco3+Sco4+Sco5, thus it is possible to extract the first dark current So1 of the first electric load 201 as shown in FIG. 13A. The battery sensor 30 multiplies the second carrier signal Sc2 having the second carrier frequency fc2 by the mixed dark currents Sco1+Sco2+Sco3+Sco4+Sco5, thus it is possible to extract the second dark current So2 of the second electric load 202 as shown in FIG. 13B. The battery sensor 30 multiplies the third carrier signal Sc3 having the third carrier frequency fc3 by the mixed dark currents Sco1+Sco2+Sco3+Sco4+Sco5, thus it is possible to extract the third dark current So3 of the third electric load 203 as shown in FIG. 13C. The battery sensor 30 multiplies the fourth carrier signal Sc4 having the fourth carrier frequency fc4 by the mixed dark currents Sco1+Sco2+Sco3+Sco4+Sco5, thus it is possible to extract the fourth dark current So4 of the fourth electric load 204 as shown in FIG. 13D. The battery sensor 30 multiplies the fifth carrier signal Sc5 having the fifth carrier frequency fc5 by the mixed dark currents Sco1+Sco2+Sco3+Sco4+Sco5, thus it is possible to extract the fifth dark current So5 of the fifth electric load 205 as shown in FIG. 13E.

Then, the battery sensor 30 detects the consumption of the excessive dark current (1040).

The battery sensor 30 can store the allowable dark current of the electric load 200. For example, the battery sensor 30 may store the allowable dark currents of the first, second, third, fourth and fifth electric loads 201, 202, 203, 204, and 205.

The battery B can compare the dark current So demodulated with the allowable dark current, and can detect the excessive dark current based on the comparison result. For example, if the demodulated dark current So of the electric load 200 is larger than the allowable dark current, the battery B can judge that the dark current of the electric load 200 is excessive.

The battery sensor 30 transmits the excessive dark current data to the integrated control unit 100 (1050).

The battery sensor 30 may transmit information on the dark current So to the integrated control unit 100 or may transmit information on consumption of the excessive dark current to the integrated control unit 100 through the vehicle communication network NT.

The integrated control unit 100 identifies the electric loads that have consumed the excessive dark current (1060).

The integrated control unit 100 can identify the electric load consuming the excessive dark current based on the information on the dark current So or the information on the consumption of the excessive dark current from the battery sensor 30.

The integrated control unit 100 requests the electric load consuming the excessive dark current to enter the sleep mode (1070).

The integrated control unit 100 may request the electric load consuming the excessive dark current to enter the sleep mode through the vehicle communication network NT.

After entering the sleep mode, the electric load 200 again modulates the dark current (1080). The battery sensor 30 demodulates the dark current again (1090). The battery sensor 30 detects the consumption of the excessive dark current (1100). The battery sensor 30 transmits the excessive dark current data to the integrated control unit 100 (1110). The integrated control unit 100 identifies the electric load that consumes the excessive dark current (1120).

Operations 1080, 1090, 1100, 1110, and 1120 may be identical to operations 1020, 1030, 1040, 1050, and 1060, respectively.

If the electric load that consumes the excessive dark current identified in operation 1060 is equal to the electric load that consumed the excessive dark current identified in operation 1120, then the integrated control unit 100 warns the driver of the excessive dark current consumption of the electric load (1130).

The integrated control unit 100 stores the identification information of the electric load consuming the excessive dark current and warns the driver of the excessive dark current consumption of the electric load when the vehicle 1 is turned on.

In addition, the integrated control unit 100 can block the power supply to the electric load consuming the excessive dark current according to the charging rate of the battery B. For example, when the charging rate of the battery B is equal to or less than a predetermined reference value, the integrated control unit 100 can block the power supply to the electric load consuming the excessive dark current.

Exemplary forms of the present disclosure have been described above. In the exemplary forms described above, some components may be implemented as a "module". Here, the term 'module' means, but is not limited to, a software and/or hardware component, such as a Field Programmable Gate Array (FPGA) or Application Specific Integrated Circuit (ASIC), which performs certain tasks. A module may advantageously be configured to reside on the addressable storage medium and configured to execute on one or more processors.

Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The operations provided for in the components and modules may be combined into fewer components and modules or further separated into additional components and modules. In addition, the components and modules may be implemented such that they execute one or more CPUs in a device.

With that being said, and in addition to the above described exemplary forms, forms can thus be implemented through computer readable code/instructions in/on a medium, e.g., a computer readable medium, to control at least one processing element to implement any above described exemplary form. The medium can correspond to any medium/media permitting the storing and/or transmission of the computer readable code.

The computer-readable code can be recorded on a medium or transmitted through the Internet. The medium may include Read Only Memory (ROM), Random Access Memory (RAM), Compact Disk-Read Only Memories (CD-ROMs), magnetic tapes, floppy disks, and optical recording medium. Also, the medium may be a non-transitory computer-readable medium. The media may also be a distributed network, so that the computer readable code is stored or transferred and executed in a distributed fashion. Still further, as only an example, the processing element could include at least one processor or at least one computer processor, and processing elements may be distributed and/or included in a single device.

While exemplary forms have been described with respect to a limited number of forms, those skilled in the art, having the benefit of this disclosure, will appreciate that other forms can be devised which do not depart from the scope as disclosed herein.

What is claimed is:

1. A vehicle comprising:
  a plurality of electric loads configured to consume a dark current during parking of the vehicle and modulate the dark current;
  a battery sensor configured to:
    sense a dark current output from a battery of the vehicle,
    demodulate the dark current modulated by electric loads of the plurality of electric loads,
    identify the dark current consumed by each electric load of the plurality of electric loads based on the demodulated dark current, and
    identify, among the plurality of electric loads, an electric load which consumes excess dark current, based on the dark current consumed by each electric load of the plurality of electric loads; and an integrated control device configured to alert a driver of consumption of the excess dark current of the identified electric load.

2. The vehicle according to claim 1, wherein the electric loads of the plurality of electric loads are configured to modulate the dark current using carrier signals each having a different frequency.

3. The vehicle according to claim 1, wherein the battery sensor is configured to demodulate the modulated dark current using carrier signals each having a different frequency.

4. The vehicle according to claim 1, wherein each of the electric loads comprises:
  a controller configured to generate a carrier signal;
  a first mixer configured to mix the dark current with the carrier signal; and
  a high pass filter configured to block low frequency signals included in the mixed dark current.

5. The vehicle according to claim 4, wherein the controller of the each of the electric loads is configured to generate carrier signals having different frequencies.

6. The vehicle according to claim 4, wherein a cut-off frequency of the high pass filter is approximately equal to a frequency of the carrier signal.

7. The vehicle according to claim 1, wherein the battery sensor comprises:
  a controller configured to generate carrier signals having different frequencies;
  a second mixer configured to mix the modulated dark current with the carrier signals having the different frequencies; and
  a low pass filter configured to block high frequency signals included in the mixed dark current.

8. The vehicle according to claim 7, wherein the controller is configured to sequentially generate the carrier signals having the different frequencies, and the second mixer is configured to sequentially mixed the modulated dark current with the carrier signals having the different frequencies.

9. The vehicle according to claim 7, wherein a cut-off frequency of the low pass filter is approximately equal to a lowest frequency among the different frequencies.

10. The vehicle according to claim 1, wherein the integrated control device is configured to block power supply to the electric load which consumes the excess dark current.

11. A method for controlling a vehicle, the method comprising:
  modulating, by a plurality of electric loads, a dark current consumed during parking of the vehicle;
  demodulating, by a battery sensor, the modulated dark current output from a battery;
  identifying, by the battery sensor, the dark current consumed by each electric load of the plurality of electric loads based on the demodulated dark current;
  identifying by the battery sensor, among the plurality of electric loads, an electric load which consumes excess dark current, based on the dark current consumed by each electric load of the plurality of electrical loads; and
  warning, by a control device, a driver of consumption of the excess dark current of the identified electric load.

12. The method according to claim 11, wherein modulating the dark current comprises: modulating, by each electric load of the plurality of electric loads, the dark current using carrier signals having different frequencies.

13. The method according to claim 11, wherein demodulating the dark current comprises: demodulating the modulated dark current using carrier signals having different frequencies.

14. The method according to claim 11, wherein modulating the dark current comprises:
  mixing, by a mixer, the dark current with a carrier signal; and
  blocking, by a high pass filter, low frequency signals included in the mixed dark current.

15. The method according to claim 11, wherein demodulating the dark current comprises:
  mixing, by a mixer, the modulated dark current with carrier signals having different frequencies; and
  blocking, by a low pass filter, high frequency signals included in the mixed dark current.

16. A vehicle comprising:
  a plurality of electric loads configured to consume a dark current during parking of the vehicle and modulate the dark current;
  a battery sensor configured to:
    sense a dark current output from a battery of the vehicle,
    demodulate the dark current modulated by electric loads of the plurality of electric loads,
    identify the dark current consumed by each electric load of the plurality of electric loads based on the demodulated dark current; and
  an integrated control device configured to identify, among the plurality of electric loads, an electric load which consumes excess dark current, based on the dark current consumed by each electric load of the plurality of electric loads, and configured to block power supply to the electric load consuming the excessive dark current.

17. The vehicle according to claim 16, wherein each of the electric loads comprises:
  a controller configured to generate a carrier signal;
  a first mixer configured to mix the dark current with the carrier signal; and
  a high pass filter configured to block low frequency signals included in the mixed dark current.

18. The vehicle according to claim 17, wherein the controller of the each of the electric loads is configured to generate carrier signals having different frequencies.

19. The vehicle according to claim 16, wherein the battery sensor comprises:
  a controller configured to generate carrier signals having different frequencies;
  a second mixer configured to mix the modulated dark current with the carrier signals having the different frequencies; and
  a low pass filter configured to block high frequency signals included in the mixed dark current.

20. The vehicle according to claim 19, wherein the controller is configured to sequentially generate the carrier signals having the different frequencies, and the second mixer is configured to sequentially mix the modulated dark current with the carrier signals having the different frequencies.

* * * * *